US006968958B2

(12) United States Patent
Lauchner et al.

(10) Patent No.: US 6,968,958 B2
(45) Date of Patent: Nov. 29, 2005

(54) STACKABLE AND DETACHABLY COUPLED ELECTRONIC DEVICE MODULES

(75) Inventors: Craig Edward Lauchner, Mountain View, CA (US); Robert E. Hintz, San Jose, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/289,950

(22) Filed: Nov. 7, 2002

(65) Prior Publication Data

US 2004/0089618 A1    May 13, 2004

(51) Int. Cl.[7] .............................................. A47F 7/00
(52) U.S. Cl. ....................................... 211/26; 361/735
(58) Field of Search ................... 211/26, 26.2, 49.1, 211/126.12, 188, 194, 126.15; 206/503, 504, 206/509, 511, 512, 701; 312/223.1, 223.2, 312/42, 273, 330.1, 348.1, 348.2, 223.6; 361/679, 683, 724, 725, 727, 735, 729, 728, 361/829

(56) References Cited

U.S. PATENT DOCUMENTS

| 3,141,554 | A | * | 7/1964 | Sussman et al. ......... 211/126.4 |
| 3,918,781 | A | * | 11/1975 | Paris ........................... 312/111 |
| 4,681,378 | A | * | 7/1987 | Hellman, III ............. 312/223.2 |
| 5,186,338 | A | * | 2/1993 | Boutet .......................... 211/40 |
| 5,305,187 | A | * | 4/1994 | Umezu et al. ............... 361/784 |
| 5,319,520 | A | * | 6/1994 | Sugiyama et al. ........... 361/693 |
| 5,369,549 | A | * | 11/1994 | Kopp et al. .................. 361/679 |
| 5,487,599 | A | * | 1/1996 | Weisburn et al. .......... 312/9.46 |
| 5,630,658 | A | * | 5/1997 | Jeter ........................... 312/107 |
| 5,685,439 | A | * | 11/1997 | Luenser ....................... 211/183 |
| 5,685,441 | A | * | 11/1997 | Calfee ......................... 211/194 |
| 5,808,871 | A | * | 9/1998 | Rosecan et al. ............ 361/730 |
| 5,949,653 | A | * | 9/1999 | Weng .......................... 361/735 |
| 6,085,925 | A | * | 7/2000 | Chung ........................ 220/4.02 |
| 6,088,224 | A | * | 7/2000 | Gallagher et al. .......... 361/695 |
| 6,246,580 | B1 | * | 6/2001 | Weng .......................... 361/695 |
| 6,618,246 | B2 | * | 9/2003 | Sullivan et al. ............. 361/685 |
| 2002/0017838 | A1 | * | 2/2002 | Roesner et al. .......... 312/223.1 |
| 2002/0033655 | A1 | * | 3/2002 | Chen ........................ 312/223.2 |
| 2002/0063100 | A1 | * | 5/2002 | Kwang .......................... 211/40 |
| 2003/0019823 | A1 | * | 1/2003 | Corbett et al. ................ 211/26 |
| 2003/0042824 | A1 | * | 3/2003 | Coffin et al. ............. 312/223.2 |

* cited by examiner

Primary Examiner—Jennifer E. Novosad

(57) ABSTRACT

An apparatus comprises a first electronic device module that comprises a structural stackable rack component that is attached to and supports an electronic device. A second electronic device module that comprises a stackable rack component that is attached to and supports an electronic device is stackable on and detachably coupled to the first electronic device module.

26 Claims, 2 Drawing Sheets

STACKABLE AND DETACHABLY COUPLED ELECTRONIC DEVICE MODULES

BACKGROUND

In one design, one or more server/storage devices are connected to a server/storage device rack. The server/storage device rack has a predefined height and number of connection locations. The server/storage device rack has connection locations for a plurality of server/storage devices. The server/storage device rack is initially free of any server/storage devices. The server/storage devices are installed to the server/storage device rack as needed. Once the server/storage device rack is full and no additional free connection locations exist, a second server/storage device rack is required to accommodate future server/storage devices.

The server/storage devices extend out from the server/storage device rack on slide components. The slide components have an inner slide component and an outer slide component. The inner slide component fits within a track in the outer slide component. The inner slide component is preinstalled to the server/storage device. The outer slide component is preinstalled to the server/storage device rack. In one method of installation of the server/storage device to the server/storage device rack, the inner slide component is precisely aligned into the track in the outer slide component. The inner slide follows in the track until the server/storage device reaches a predetermined resting location on the server/storage device rack.

As one shortcoming, the server/storage device rack is designed to accommodate a fixed number of server/storage devices. Disadvantageously, such design does not allow for customizing the size of the server/storage device rack based on the number of server/storage devices. As another shortcoming, it is very difficult to precisely align the inner slide component with the track in the outer slide component. Misalignment of the inner slide component with the track in the outer slide component can damage the slide component. As yet another shortcoming, installing the server/storage devices to the server/storage device rack takes a considerable amount of time. As yet another shortcoming, the user must purchase the server/storage device rack up front which can be a costly investment.

SUMMARY

The invention in one embodiment encompasses an apparatus. The apparatus includes a first electronic device module that comprises a structural stackable rack component that is attached to and supports an electronic device and a second electronic device module that comprises a structural stackable rack component that is attached to and supports an electronic device. The second electronic device module is stackable on and detachably coupled to the first electronic device module.

Another embodiment of the invention encompasses an apparatus. The apparatus includes an electronic device module comprising a structural stackable rack component coupled with an electronic device. The structural stackable rack component comprises a slide component and a support component. The electronic device is preassembled to the slide component and the slide component is preassembled to the support component.

Yet another embodiment of the invention encompasses a method. A first structural stackable rack component is stacked onto a second structural stackable rack component. The first structural stackable rack component is fastened to the second structural stackable rack component. The first and second electronic devices are preassembled to the respective first and second structural stackable rack components.

A further embodiment of the invention encompasses a method. A first electronic device is attached to a first structural stackable rack component. A second electronic device is attached to a second structural stackable rack component. The first structural stackable rack component comprises a means to stack onto the second structural stackable rack component. The first structural stackable rack component comprises a means to attach to the second structural stackable rack component.

DESCRIPTION OF THE DRAWINGS

Features of exemplary implementations of the invention will become apparent from the description, the claims, and the accompanying drawings in which:

DETAILED DESCRIPTION

Figure 1:
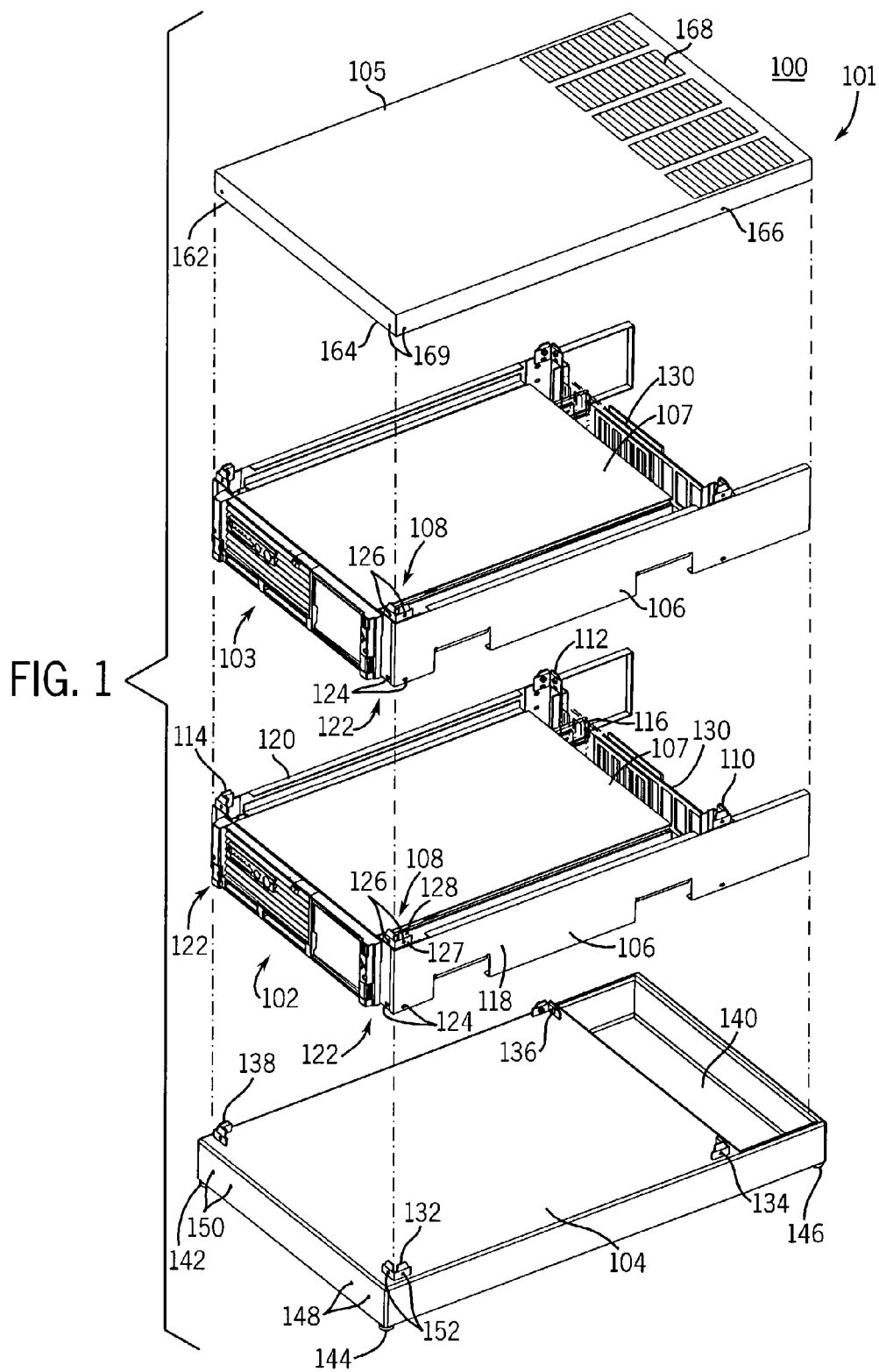
FIG. 1 is an exploded representation of an apparatus comprising one or more electronic device modules stacked together, the one or more electronic device modules stacked on top of a base component, and a cover component stacked on top of the one or more electronic device modules.

Turning to FIG. 1, an apparatus 100 in one example comprises a first electronic device module that comprises a structural stackable rack component that is attached to and supports an electronic device and a second electronic device module that comprises a structural stackable rack component that is attached to and supports an electronic device. The second electronic device module is stackable on and detachably coupled to the first electronic device module. The apparatus 100 includes a plurality of components. A number of such components can be combined or divided in the apparatus 100.

The apparatus 100 comprises a stack 101. The stack 101 comprises one or more of electronic device modules 102 and 103, a base component 104, and a cover component 105. The electronic device module 103 is stackable onto one or more of the electronic device module 102 and the base component 104. One or more of the electronic device module 103 and the cover component 105 are stackable onto the electronic device module 102.

The electronic device module 102 comprises a structural stackable rack component 106 and an electronic device 107. The structural stackable rack component 106 comprises one or more attachment components 108, 110, 112, and 114, one or more slide components 116, and one or more support components 118 and 120. The electronic device 107, in one example, comprises one or more of computers, computer servers, and storage devices.

A connection is made between the structural stackable rack component 106 of the electronic device module 102 and the structural stackable rack component 106 of the electronic device module 103. The connection comprises a detachable coupling. The connection is made through the one or more attachment components 108, 110, 112, and 114. The one or more attachment components 108, 110, 112, and 114 comprise one or more of fastening components, clips, clamps, pins, and screws. In one example, the attachment component 108 comprises a guided attachment component of the electronic device module 102. The guided attachment component of the electronic device module 102 connects to a mating attachment component 122 of the electronic device module 103. The mating attachment component 122 receives the guided attachment component. Upon the mating attachment component 122 aligning with the guided attachment component, one or more holes 124 in the mating attachment component 122 align with one or more holes 126 in the guided attachment component. A fastening component passes through the one or more holes 124 and 126 securing the mating attachment component 122 to the guided attachment component, therefore detachably coupling the electronic device module 103 to the electronic device module 102.

The guided attachment component comprises a connection portion 127 and one or guiding portions 128. The connection portion 127 comprises the one or more holes 126. In one example, the fastening component attaches the electronic device module 103 to the electronic device module 102 at the connection portion 127. The one or more guiding portions 128 extend from the connection portion 127. The one or more guiding portions 128 are angled inward towards a center of the electronic device module 102. For example, the connection portion 127 is located in a vertical plane and the one or more guiding portions 128 lie in a plane between the vertical plane and a horizontal plane passing through an abutment of the connection portion 127 and the one or more guiding portions 128. The plane of the one or more guiding portions 128 is angled above the horizontal plane and below the vertical plane. The one or more guiding portions 128 angled inward towards the center of the electronic device module 102 promote alignment during installation of the mating attachment component 122 to the guided attachment component. The one or more guiding portions 128 direct the mating attachment component 122 onto the guided attachment component.

Figure 2:
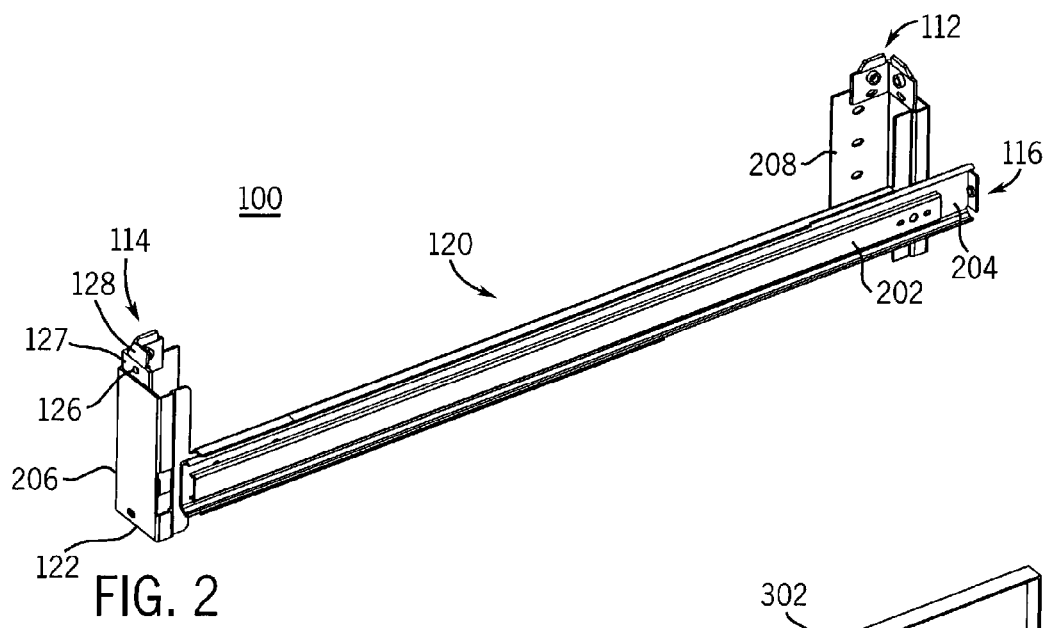
FIG. 2 is a representation of a first portion of a structural stackable rack component of the one or more electronic device modules of the apparatus of FIG. 1.

Referring to FIGS. 1–2, the one or more slide components 116 allow the electronic device 107 to extend out from the structural stackable rack component 106. In one example, the one or more slide components 116 comprise an inner slide component 202 and an outer slide component 204. The outer slide component 204 is fixed in place on the structural stackable rack component 106. The inner slide component 202 extends out from the outer slide component 204. The electronic device 107 is pre-assembled to the one or more slide components 116. The one or more slide components 116 are preassembled to the one or more support components 118 and 120. In one example, a cable management component 130 slides with the electronic device 107 during extension from the structural stackable rack component 106. The cable management component 130 comprises an organizational tool for connection cables coming into and out of the electronic device module 102.

Figure 3:
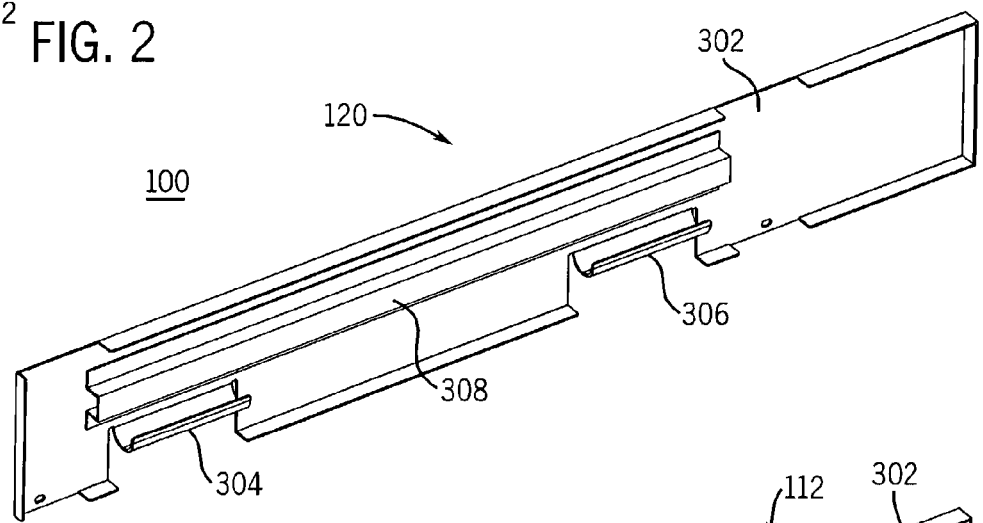
FIG. 3 is a representation of a second portion of the structural stackable rack component of the one or more electronic device modules of the apparatus of FIG. 1.

Referring to FIGS. 2–3, the one or more support components 118 (shown in FIG. 1) and 120 comprise one or more columns 206 and 208 and a side component 302. The side component 302 is attached to the one or more columns 206 and 208. The base of the column 206 comprises the mating attachment component 122. The top of the column 206 comprises the attachment component 114. Therefore, the column 206 of the electronic device module 103 is stackable on and detachably coupled to the corresponding column 206 of the electronic device module 102. The column 206 of the electronic device module 103 is also stackable on and detachably coupled to the corresponding column 206 of an additional electronic device module similar to the electronic device modules 102 and 103. Alternatively, the column 206 of the electronic device module 102 and the column 206 of the additional electronic device module are stackable on and detachably coupled to the column 206 of the electronic device module 103.

Referring to FIG. 3, the side component 302 comprises one or more handles 304 and 306 and a reinforcement component 308. In one example, the one or more handles 304 and 306 are formed out of the side component 302 by bending a portion of the side component 302. The one or more handles 304 and 306 provide a location for lifting the electronic device module 102. The reinforcement component 308 provides additional support for the side component 302. The reinforcement component 308 prevents the side component 302 from bowing, bending, or otherwise deforming under a stress. In one example, the reinforcement component 308 comprises a strengthening beam.

Figure 4:
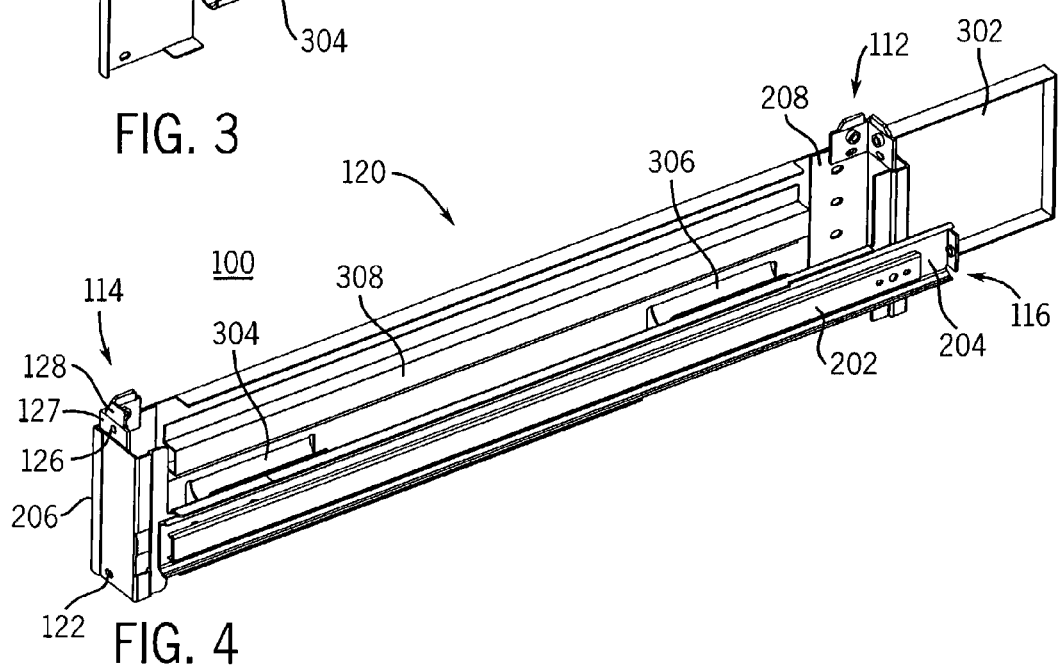
FIG. 4 is a representation of an attachment of the first and second portions of the structural stackable rack component of the one or more electronic device modules of the apparatus of FIG. 1.

Referring to FIG. 4, the columns 206 and 208 and side component 302 are designed to be a specific height based on a height of the electronic device 107 the support components 120 accommodates. The columns 206 and 208 and side component 302 may be designed to accommodate electronic devices 107 of varying heights. The columns 206 and 208 and side component 302 may be designed to accommodate a plurality of the electronic devices 107. The plurality of the electronic devices 107 may be attached together and then attached to the slide component 302 of the electronic device module 102 as a unit.

Referring to FIG. 1, the base component 104 comprises a bottom layer of the stack 101. The base component 104 comprises one or more of attachment components 132, 134, 136, and 138, extra storage locations 140, and foundation components 142, 144, and 146. The attachment components 132, 134, 136, and 138 comprise substantially the same or similar form and function as the attachment components 108, 110, 112, and 114 of the electric device module 102. The extra storage location 140 comprises one or more of pockets, shelves, or open spaces to store additional components in the electronic device module 102. In one example, the extra storage locations 140 comprises a location for a power distribution unit used by the electronic device modules 102 and 103 of the stack 101. The foundation components 142, 144, and 146 comprise one or more of movement assisting components and stabilizing components. In one example, the movement assisting components comprise wheels or casters. In one example, the stabilizing components comprise leveling feet. The base component 104 may additionally comprise one or more anti-tip feet. The anti-tip feet connect to the base component 104 through holes 148 and 150. The anti-tip feet extend out from the base component 104 to provide a wider base area to prevent the stack 101 from tipping over.

A connection is made between the electronic device module 102 and the base component 104. The connection is made through the one or more attachment components 132, 134, 136, and 138. The one or more attachment components 132, 134, 136, and 138 comprise one or more of fastening components, clips, clamps, pins, and screws. In one example, the attachment component 132 comprises a guided attachment component of the base component 104. The guided attachment component connects to a mating attachment component 122 of the electronic device module 102. The mating attachment component 122 receives the guided attachment component. Upon the mating attachment component 122 aligning with the guided attachment component, one or more holes 124 in the mating attachment component 122 align with one or more holes 152 in the guided attachment component. In one example, a fastening component passes through the one or more holes 124 and 152 securing the mating attachment component 122 to the guided attachment component, therefore detachably coupling the electronic device module 102 to the base component 104.

The cover component 105 comprises a top layer of the stack 101. The cover component 105 comprises one or more of attachment components 162, 164, and 166. The cover component 105 may additionally comprise a ventilation component 168. Further, the cover component 105 may comprise one or more holes. The one or more holes allow cables to pass through the cover component 105 to reach components within the stack 101 or for cables to reach out of the stack 101. A connection is made between the electronic device module 102 and the cover component 105. The connection is made through the one or more attachment components 162, 164, and 166. The one or more attachment components 162, 164, and 166 comprise one or more of fastening components, clips, clamps, pins, and screws. In one example, the attachment component 164 comprises a mating attachment component of the cover component 105. The mating attachment component connects to the attachment component 108 of the electronic device module 102. The mating attachment component receives the attachment component 108. Upon the mating attachment component aligning with the attachment component 108, one or more holes 169 in the mating attachment component align with one or more holes 126 in the attachment component 108. In one example, a fastening component passes through the one or more holes 169 and 126 securing the mating attachment component to the attachment component 108, therefore detachably coupling the cover component 105 to the electronic device module 102. The ventilation component 168 comprises one or more cutouts in the cover component 105. The ventilation component 168 provides a cooling system for the stack 101.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
 a first electronic device module that comprises a first structural stackable rack component that is attached to and supports a first electronic device; and
 a second electronic device module that comprises a second structural stackable rack component that is attached to and supports a second electronic device;
 wherein the second electronic device module is stackable on and detachably coupled to the first electronic device module;
 wherein the first structural stackable rack component comprises an attachment component, wherein the attachment component comprises a connection portion and a guiding portion, wherein the second structural stackable rack component comprises a mating attachment component;
 wherein the guiding portion is angled towards a center of the first electronic device module to guide the mating attachment component to a position adjacent to the connection portion during placement of the second electronic device module onto the first electronic device module;
 wherein the mating attachment component detachably fastens to the connection portion.

2. The apparatus of claim 1, wherein one or more third electronic device modules are stackable on and detachably coupled to the second electronic device module.

3. The apparatus of claim 1, wherein the first electronic device module comprises a plurality of attachment components, wherein the second electronic device module comprises a plurality of mating attachment components.

4. The apparatus of claim 1, wherein the connection portion is substantially oriented in a vertical plane;
 wherein a horizontal plane passes through an abutment of the connection portion and the guiding portion, wherein the horizontal plane is perpendicular to the vertical plane;
 wherein the guiding portion is oriented in a plane between the vertical plane and the horizontal plane, wherein the plane of the guiding portion is angled above the horizontal plane.

5. The apparatus of claim 1, wherein the connection portion comprises one or more first holes, wherein the mating attachment component comprises one or more second holes aligned with the one or more first holes;
 wherein the second electronic device module is secured to the first electronic device module by attachment through the one or more respective first and second holes.

6. The apparatus of claim 1, wherein the mating attachment component comprises one or more clamps, wherein the attachment component comprises one or more clamp receiving components, wherein the one or more clamps secure the second electronic device module to the first electronic device module.

7. The apparatus of claim 1, wherein the first electronic device module is stackable on and detachably coupled to a base component.

8. The apparatus of claim 7, wherein the base component comprises one or more guided attachment components, wherein the first electronic device module comprises one or more mating attachment components;
 wherein the one or more mating attachment components fasten to the one or more respective guided attachment components.

9. The apparatus of claim 7, wherein the base component comprises a storage location for a power distribution unit.

10. The apparatus of claim 7, wherein the base component comprises one or more stabilizing components.

11. The apparatus of claim 7, wherein the base component comprises one or more wheels or one or more casters for movement of the first and second electronic device modules.

12. The apparatus of claim 7, wherein the base component comprises one or more anti-tip feet, wherein the one or more anti-tip feet protrude out beyond a periphery of the base component for tip prevention.

13. The apparatus of claim 1, wherein a cover component is stackable on the second electronic device module.

14. The apparatus of claim 13, wherein the second electronic device module comprises one or more guided attachment components, wherein the cover component comprises one or more mating attachment components;
   wherein the one or more mating attachment components fasten to the one or more respective guided attachment components.

15. The apparatus of claim 1, wherein the first structural stackable rack component comprises an opening, wherein the opening accommodates the first electronic device.

16. The apparatus of claim 1, wherein the first and second electronic device modules comprise one or more formed handles.

17. The apparatus of claim 1, wherein the first structural stackable rack component comprises one or more reinforcement components.

18. The apparatus of claim 1, wherein the guiding portion is angled towards the center of the first electronic device module to correct a misalignment between the mating attachment component and the connection portion during placement of the second electronic device module onto the first electronic device module.

19. The apparatus of claim 1, wherein the first electronic device module comprises a first slide component, wherein the first slide component supports the first electronic device;
   wherein the second electronic device module comprises a second slide component, wherein the second slide component supports the second electronic device;
   wherein the first slide component allows the first electronic device to extend out from the first structural stackable rack component, wherein the second slide component allows the second electronic device to extend out from the second structural stackable rack component.

20. The apparatus of claim 19, wherein a first portion of the first slide component is attached to the first structural stackable rack component, wherein a second portion of the first slide component is attached to the first electronic device;
   wherein the second portion of the first slide component is movable relative to the first portion of the first slide component to move the first electronic device outside of a periphery of the first structural stackable rack component.

21. The apparatus of claim 1, wherein the first electronic device comprises a first computer server, wherein the second electronic device comprises a second computer server;
   wherein the second electronic device module is stackable on and detachably coupled to the first electronic device module to form a computer server rack for the first and second computer servers.

22. The apparatus of claim 21, wherein one or more cables connect with the first computer server;
   wherein the first electronic device module comprises a cable management component to hold and organize the one or more cables.

23. The apparatus of claim 22, wherein the first electronic device module comprises a slide component;
   wherein upon movement of the first computer server on the slide component, the cable management component moves with the first computer server.

24. An apparatus, comprising:
   a first electronic device module that comprises a first structural stackable rack component that is attached to and supports a first electronic device; and
   a second electronic device module that comprises a second structural stackable rack component that is attached to and supports a second electronic device;
   wherein the second electronic device module is stackable on and detachably coupled to the first electronic device module;
   wherein the first structural stackable rack component comprises an attachment component, wherein the attachment component comprises a connection portion and a guiding portion, wherein the second structural stackable rack component comprises a mating attachment component;
   wherein the guiding portion is angled towards a center of the first electronic device module to guide the mating attachment component to a position adjacent to the connection portion during placement of the second electronic device module onto the first electronic device module;
   wherein the mating attachment component detachably fastens to the connection portion, wherein the connection portion comprises a first face and a second face, wherein the first face is perpendicular with the second face;
   wherein the guiding portion comprises a first tab and a second tab, wherein the first tab is angled off the first face towards the center of the first electronic device module, wherein the second tab is angled off the second face towards the center of the second electronic device module.

25. The apparatus of claim 24, wherein the connection portion comprises a first hole through the first face, wherein the connection portion comprises a second hole through the second face;
   wherein the mating attachment component comprises a first hole that aligns with the first hole of the connection portion, wherein the mating attachment component comprises a second hole that aligns with the second hole of the connection portion;
   wherein to attach the mating attachment component with the connection portion, one or more fasteners pass through one or more of:
      the first hole of the connection portion and the first hole of the mating attachment component; and
      the second hole of the connection portion and the second hole of the mating attachment component.

26. An apparatus, comprising:
   a first electronic device module that comprises a first structural stackable rack component that is attached to and supports a first electronic device; and
   a second electronic device module that comprises a second structural stackable rack component that is attached to and supports a second electronic device;
   wherein the second electronic device module is stackable on and detachably coupled to the first electronic device module;
   wherein the first structural stackable rack component comprises an attachment component, wherein the attachment component comprises a connection portion and a guiding portion, wherein the second structural stackable rack component comprises a mating attachment component;
   wherein the guiding portion is angled towards a center of the first electronic device module to guide the mating attachment component to a position adjacent to the connection portion during placement of the second electronic device module onto the first electronic device module;

wherein the mating attachment component detachably fastens to the connection portion, wherein the attachment component comprises a first attachment component, wherein the first electronic device module comprises three other attachment components substantially similar to the first attachment component; wherein the first attachment component and the three other attachment components are positioned to provide connection at four corner portions between the first and second electronic device modules.

* * * * *